US012772760B2

(12) United States Patent
Remnev et al.

(10) Patent No.: US 12,772,760 B2
(45) Date of Patent: Oct. 20, 2026

(54) METHODS OF FILLING TRENCHES ON SUBSTRATE SURFACE

(71) Applicant: ASM IP Holding B.V., Almere (NL)

(72) Inventors: Alexey Remnev, Kawasaki (JP); Takahiro Kawashima, Inagi (JP); Frank Wilson Amalraj, Tama (JP); Tamal Saha, Machida (JP)

(73) Assignee: ASM IP Holding B.V., Almere (NL)

( * ) Notice: Subject to any disclaimer, the term of this patent is extended or adjusted under 35 U.S.C. 154(b) by 199 days.

(21) Appl. No.: 18/894,170

(22) Filed: Sep. 24, 2024

(65) Prior Publication Data

US 2025/0104999 A1 Mar. 27, 2025

Related U.S. Application Data

(60) Provisional application No. 63/540,715, filed on Sep. 27, 2023.

(51) Int. Cl.

*H10P 14/60* (2026.01)
*C23C 16/505* (2006.01)
*C23C 16/56* (2006.01)
*H10P 50/28* (2026.01)

(52) U.S. Cl.

CPC ........ *H10P 14/6339* (2026.01); *C23C 16/505* (2013.01); *C23C 16/56* (2013.01); *H10P 50/283* (2026.01)

(58) Field of Classification Search

None

See application file for complete search history.

(56) References Cited

U.S. PATENT DOCUMENTS

| | | | | |
|---|---|---|---|---|
| 10,388,513 | B1 | 8/2019 | Blanquart | |
| 10,755,922 | B2 | 8/2020 | Blanquart | |
| 11,049,716 | B2 | 6/2021 | Tang | |
| 11,705,333 | B2 | 7/2023 | Susa | |
| 2003/0068853 | A1 * | 4/2003 | Conti | C23C 16/401 438/200 |
| 2022/0251707 | A1 | 8/2022 | Susa | |
| 2022/0336204 | A1 | 10/2022 | Miyama | |
| 2024/0043990 | A1 | 2/2024 | Susa | |

* cited by examiner

*Primary Examiner* — Shamim Ahmed

(74) *Attorney, Agent, or Firm* — Snell & Wilmer L.LP.

(57) ABSTRACT

A method of filling trenches on a surface of a substrate is provided. The method may comprise comprises the steps of providing a substrate within a reaction chamber, the substrate comprising a plurality of narrow trenches and wide trenches formed on a surface of the substrate; a 1st deposition step comprising: (a) flowing a carbon precursor into the reaction chamber; and (b) exposing the carbon precursor to a plasma, wherein the carbon precursor reacts to form a first deposited material; (c) exposing the first deposited material to a post-deposition treatment to cause the first deposited material to flow within the trenches; (d) etching the first deposited material, wherein the first deposited material is substantially level in the narrow trenches and recessed in the wide trenches; and a 2nd deposition step comprising: (e) flowing the carbon precursor with the carrier gas into the reaction chamber; and (f) exposing the carbon precursor to a plasma, wherein the carbon precursor reacts to form a second deposited material on the first deposited material.

21 Claims, 5 Drawing Sheets

| Step | Filling profile in different locations in a die | | Inside trench | Overburden delta |
|---|---|---|---|---|
| | L1: Narrow trenches | L2 : Wide trenches | | |
| 301 |  |  | <u>Smaller voids</u> | Large (50nm) |
| 308 |  |  | No void | Large (60nm) |

| Step | Filling profile in different locations | | Inside trench | Overburden delta (planarity) |
|---|---|---|---|---|
| | L1: Narrow trenches | L2 : Wide trenches | | |
| 102 |  |  | Larger voids | Nearly zero |
| 108 |  |  | No void | Moderate (25nm) |
| 109 |  |  | Leveled in L1 and recessed in L2 | Moderate (25nm) |
| 112 |  |  | No void | Nearly zero (<10nm) |

METHODS OF FILLING TRENCHES ON SUBSTRATE SURFACE

CROSS-REFERENCE TO RELATED APPLICATIONS

This application claims priority to U.S. Provisional Patent Application Ser. No. 63/540,715 filed Sep. 27, 2024 titled METHODS OF FILLING TRENCHES ON SUBSTRATE SURFACE, the disclosure of which is hereby incorporated by reference in its entirety.

FIELD OF INVENTION

The present disclosure generally relates to methods of forming structures suitable for use in the manufacture of electronic devices. More particularly, examples of the disclosure relate to methods of forming structures including depositing a material layer that may fill trenches on a surface of the structure.

BACKGROUND OF THE DISCLOSURE

During the manufacture of devices, such as semiconductor devices, it is often desirable to fill trenches on the surface of a substrate. Some techniques to fill trenches include the deposition of a layer of flowable material, such as a flowable carbon material.

Although use of flowable carbon material to fill trenches may work well for some applications, filling both narrow trenches and wide trenches using traditional deposition techniques of flowable carbon may cause a large difference of thickness (overburden delta) between narrow trenches and wide trenches. Accordingly, improved methods for forming structures, particularly for methods of filling narrow trenches and wide trenches on a substrate surface with material, that reduce the overburden delta are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with exemplary embodiments of the disclosure, a method of filling trenches on substrate surface is provided. This method comprises steps of providing a substrate within a reaction chamber, the substrate comprising a plurality of narrow trenches and wide trenches formed on a surface of the substrate; a 1st deposition step comprising: (a) flowing a carbon precursor into the reaction chamber; and (b) exposing the carbon precursor to a plasma, wherein the carbon precursor reacts to form a first deposited material; (c) exposing the first deposited material to a post-deposition treatment to cause the first deposited material to flow within the trenches; (d) etching the first deposited material, wherein the first deposited material is substantially level in the narrow trenches and recessed in the wide trenches; and a 2nd deposition step comprising: (e) flowing the carbon precursor with into the reaction chamber; and (f) exposing the carbon precursor to a plasma, wherein the carbon precursor reacts to form a second deposited material on the first deposited material.

In accordance with further exemplary embodiments of the disclosure, the steps (d) to (f) may be repeated.

In accordance with further exemplary embodiments of the disclosure, the method may further comprise a step (g) exposing the second deposited material to a post-deposition treatment.

In accordance with further exemplary embodiments of the disclosure, the steps (d) to (g) may be repeated.

In accordance with further exemplary embodiments of the disclosure, a temperature during the step of the first deposition may be from about 50° C. to about 600° C.

In accordance with further exemplary embodiments of the disclosure, the post-deposition treatment may comprise heating the substrate to a temperature of about 100° C. to about 800° C.

In accordance with further exemplary embodiments of the disclosure, a temperature during the step of the second deposition may be from about 50° C. to about 800° C.

In accordance with further exemplary embodiments of the disclosure, a power of the plasma may be less than 2000 W.

In accordance with further exemplary embodiments of the disclosure, a frequency of the plasma may be 3 to 30 MHz with single RF power source.

In accordance with further exemplary embodiments of the disclosure, a power of the plasma of the 1st deposition step may be 200 W or less than 200 W.

In accordance with further exemplary embodiments of the disclosure, a pressure within the reaction chamber may be between about 100 Pa and about 1,300 Pa.

In accordance with further exemplary embodiments of the disclosure, the post-deposition treatment may comprise a plasma treatment.

In accordance with further exemplary embodiments of the disclosure, the plasma treatment may comprise exposing an inert gas and/or a nitrogen-containing gas to a plasma.

In accordance with further exemplary embodiments of the disclosure, the nitrogen-containing gas may be selected from the group comprising nitrogen, NH3, or N2O.

In accordance with further exemplary embodiments of the disclosure, the etching may comprise exposing an inert gas and/or an oxygen-containing gas to a plasma.

In accordance with further exemplary embodiments of the disclosure, the carbon precursor may comprise a cyclic structure.

In accordance with further exemplary embodiments of the disclosure, the carbon precursor may comprise a carbonyl functional group.

In accordance with further exemplary embodiments of the disclosure, the cyclic structure may be selected from the group comprising: benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine, quinoline; isoquinoline; quinoxaline; quinazoline; cinnoline; pteridine; phthalazine; acridine; 4aH-xanthene; 4aH-thioxanthene; 4aH-phenoxazine; 4a, 10a-dihydro-10H-phenothiazine; or carbazole.

In accordance with further exemplary embodiments of the disclosure, the precursor may comprise one or more carbonyl groups and one or more of a methyl group, ethyl group, propyl group, butyl group, amine group, or hydroxy group.

In accordance with further exemplary embodiments of the disclosure, the post-deposition treatment may be conducted in a second reaction chamber.

In accordance with further exemplary embodiments of the disclosure, the etching step may be conducted in a third reaction chamber.

BRIEF DESCRIPTION OF THE DRAWING FIGURES

A more complete understanding of exemplary embodiments of the present disclosure may be derived by referring to the detailed description and claims when considered in connection with the following illustrative figures.

Figure 1:
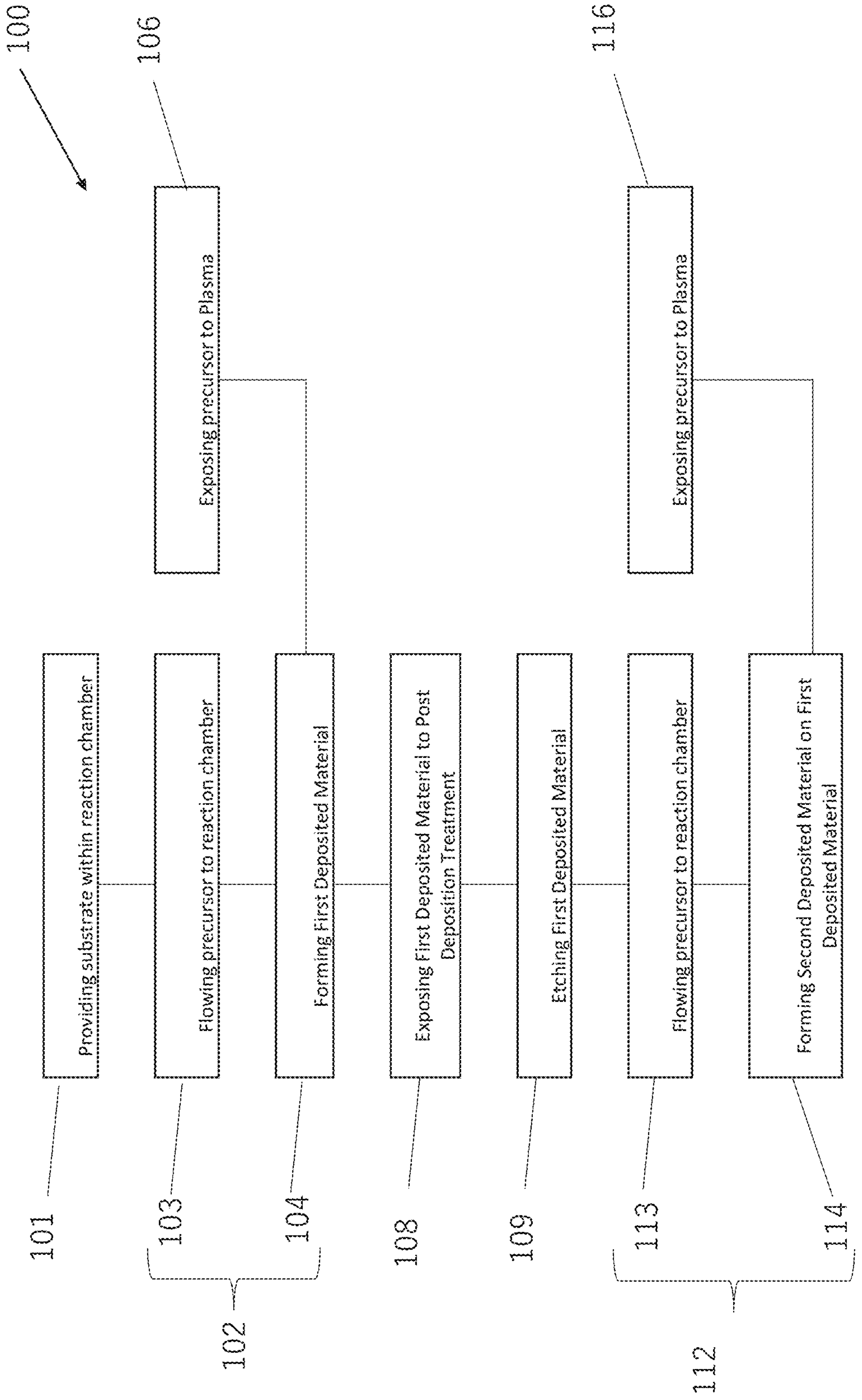
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term “substrate” may refer to any underlying material or materials, including any underlying material or materials that may be modified, or upon which, a device, a circuit, or a film may be formed. The “substrate” may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

In this disclosure, “gas” may include material that is a gas at normal temperature and pressure, a vaporized solid and/or a vaporized liquid, and may be constituted by a single gas or a mixture of gases, depending on the context. A gas introduced without passing through a gas supply unit, such as a shower plate, or the like, may be used for, e.g., sealing the reaction space, and may include a seal gas, such as a rare or other inert gas. The term inert gas, carrier gas, and dilution gas refer to a gas that does not take part in a chemical reaction to an appreciable extent and/or a gas that may excite a precursor when plasma power is applied.

As used herein, the term “film” and “thin film” may refer to any continuous or non-continuous structures and material deposited by the methods disclosed herein. For example, “film” and “thin film” could include 2D materials, nanorods, nanotubes, or nanoparticles or even partial or full molecular layers or partial or full atomic layers or clusters of atoms and/or molecules. “Film” and “thin film” may comprise material or a layer with pinholes, but still be at least partially continuous.

FIG. 1 illustrates a method 100 of filling trenches on a surface of a substrate in accordance with exemplary embodiments of the disclosure. Method 100 may include steps of providing a substrate within a reaction chamber (step 101), the substrate comprising a plurality of narrow trenches and wide trenches formed on a surface of the substrate. The method also may include a 1st deposition step 102 comprising: flowing a carbon precursor with a carrier gas into the reaction chamber (step 103); and exposing the carbon precursor to a plasma (step 106), wherein the carbon precursor reacts to form a first deposited material (step 104). After the 1st deposition step 102, the method comprises: exposing the first deposited material to a post-deposition treatment to cause the first deposited material to flow within the trenches (step 108); etching the first deposited material to etching the first deposited material, wherein the first deposited material is substantially level in the narrow trenches and recessed in the wide trenches (step 109). After that, the method further includes 2nd deposition step 112 comprising: flowing the carbon precursor with the carrier gas into the reaction chamber (step 113); and exposing the carbon precursor to a plasma (step 116), wherein the carbon precursor reacts to form a second deposited material on the first deposited material (step 114). The steps 109 to 112 may be repeated. A step to exposing the second deposited material to a post deposition treatment may be added after the step 112.

During step 101 of providing a substrate within a reaction chamber, the substrate is provided into a reaction chamber of a gas-phase reactor. In accordance with examples of the disclosure, the reaction chamber may form part of a deposition reactor, such as a plasma enhanced chemical vapor deposition (PECVD) reactor. Various steps of methods described herein may be performed (e.g., continuously) within a single reaction chamber or may be performed in multiple reaction chambers, such as reaction chambers on a cluster tool.

During step 101, the substrate may be brought to a desired temperature and/or the reaction chamber may be brought to a desired pressure, such as a temperature and/or pressure suitable for subsequent steps. By way of examples, a temperature (e.g., of a substrate or a substrate support) within a reaction chamber may range between about 50° C. to about 600° C. A pressure within the reaction chamber may range between about 100 Pa to about 1,300 Pa. In accordance with particular examples of the disclosure, the substrate includes one or more features, such as narrow trenches and wide trenches.

During step 102, a material may be deposited onto a surface of a substrate. In accordance with examples of the disclosure, material to fill the trenches may be deposited during step 102. The deposit material may solidify and may include one or more voids within a trench of the one or more trenches.

As illustrated, step 102 may include sub steps of flowing a precursor 103 with a carrier gas and exposing the precursor to a plasma 106.

During the sub step 103, a precursor suitable for forming the deposited material is provided to the reaction chamber. Low flowability may be achieved to adjust the precursor ratio to other gases.

The precursor may comprise one or more carbon atoms. In accordance with various examples of the disclosure, the precursor includes a cyclic structure and/or a carbonyl functional group. Exemplary cyclic structures include the cyclic structure selected from the group comprising: benzene; indene; cyclopentadiene; cyclohexane; pyrrole; furan; thiophene; phosphole; pyrazole; imidazole; oxazole; isoxazole; thiazole; indole; benzofuran; benzothiophene; isoindole; isobenzofuran; benzophosphole; benzimidazole; benzoxazole; benzothiazole; benzoisoxazole; indazole; benzoisothiazole; benzotriazole; purine; pyridine; phosphinine; pyrimidine; pyrazine; pyridazine; triazine; 1,2,4,5-tetrazine; 1,2,3,4-tetrazine; 1,2,3,5-tetrazine; hexazine, quinoline; isoquinoline; quinoxaline; quinazoline; cinnoline; pteridine; phthalazine; acridine; 4aH-xanthene; 4aH-thioxanthene; 4aH-phenoxazine; 4a, 10a-dihydro-10H-phenothiazine; or carbazole. Exemplary carbonyl groups may be selected from one or more of the group comprising: aldehyde, ketone, carboxylic acid, ester, amide, enone, acyl chloride, or acid anhydride. In accordance with further examples of the disclosure, the precursor includes one or more carbonyl groups and one or more of a methyl group, ethyl group, propyl group, butyl group, amine group, or a hydroxy group. The precursor may include, for example, 1-6 or 1-4 functional groups attached to a cyclic structure, wherein one or more of the functional groups includes a carbonyl functional group. The carbonyl group may include one or more functional groups—e.g., selected from the group consisting of C1-C6 (e.g., C1-C3) alkane, alkene, or alcohol functional groups. The carbonyl functional group may facilitate reflow of the deposited material during step 106. The precursor may be 2-Hydroxy-2-methylpropiophenone.

During step 106, the precursor is exposed to a (e.g., direct) plasma to cause the precursor to polymerize to thereby become a viscous fluid and to initially solidify on the substrate surface. The plasma power ranges for deposition may range from about 10 W to about 2,000 W. An RF frequency of the plasma power may range from 400 kHz to 100 MHz.

In accordance with examples of the disclosure, steps 103 and 106 may overlap. In accordance with further examples, step 106 may be shorter in duration than step 103. For example, step 106 may begin after step 103 and/or end before step 103 ends.

During step 108, the material deposited during step 101 may be caused to flow using a treatment. A treatment may include a heat treatment (e.g., raising a temperature of a substrate) and/or a plasma treatment.

In the case of heat treatment, step 108 may include heating the substrate to a temperature of about 50° C. to about 800° C. In some cases, a temperature of a substrate during step 108 may be higher than the temperature of the substrate during step 101. A pressure within the reaction chamber during step 108 may be between about 100 Pa and about 1,300 Pa. In accordance with further examples of the disclosure, an inert gas and/or a nitrogen-containing gas may be provided to the reaction chamber during step 108. Exemplary nitrogen-containing gases may comprise nitrogen, NH3, or N2O. A duration of step 108 may be from about 5 seconds to about 3,000 seconds.

In the case of plasma treatment, step 108 includes forming active species from a gas. The gas may include a nitrogen-containing gas, such as a gas selected from the group comprising nitrogen, NH3, or N2O. The activated species may be formed using, for example, a direct plasma.

A power used to form the plasma may range from about 10 W to about 2,000 W. A frequency of the power may range from about 400 kHz to about 100 MHz. A duration of a plasma treatment step may range from about 5 seconds to about 3,000 seconds. A temperature within the reaction chamber during a plasma treatment step may be about 50° C. to about 800° C. or about 100° C. to about 800° C. A pressure within the reaction chamber during a plasma treatment may be between about 100 Pa and about 1,300 Pa.

During steps 102 and/or 108, one or more inert gases, such as argon, helium, nitrogen, or any mixture thereof, may be provided to the reaction chamber (e.g., continuously provided during steps 104 and 106). A flowrate of the inert gas to the reaction chamber during this step may be from about 500 sccm to about 8,000 sccm. The inert gas may be used to facilitate ignition and/or maintenance of a plasma within the reaction chamber, to purge reactants and/or byproducts from the reaction chamber, and/or be used as a carrier gas to assist with delivery of the precursor to the reaction chamber.

Figure 2:
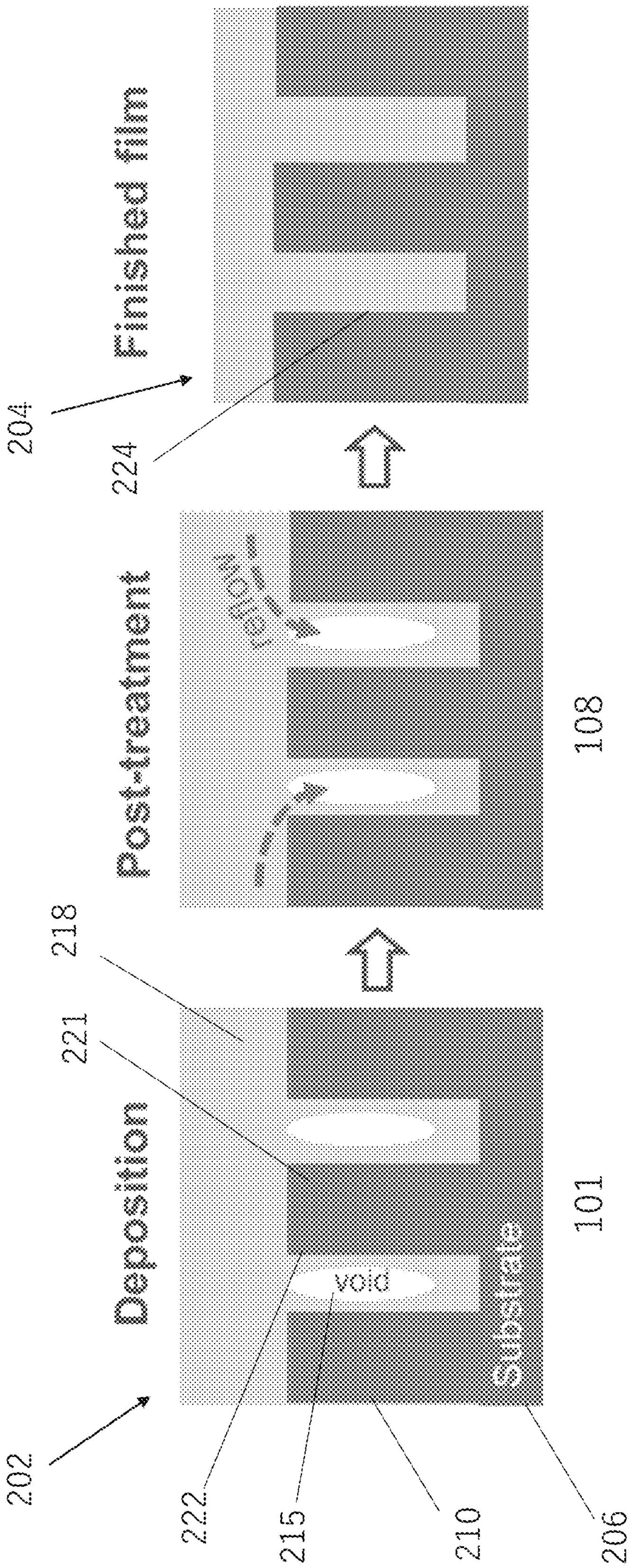
FIG. 2 illustrates a structure formed in accordance with exemplary embodiments of the disclosure.

FIG. 2 illustrates structure 202 formed in accordance with further examples of the disclosure. Structure 202 may include a substrate 206 and protrusions 210, 221 formed thereon. Structure 202 includes deposited material 218 overlying substrate 206. As illustrated, deposited material 218 from deposition step 101 includes a void 215 formed within a trench 222 between protrusions 210 and 221. After material 218 is deposited (e.g., enough material to fill trenches 222), deposited material 218 may be exposed to a post-deposition treatment (step 108) to cause deposited material 218 to flow within trench 222 to form structure 204, which includes treated material 224.

Figure 3:
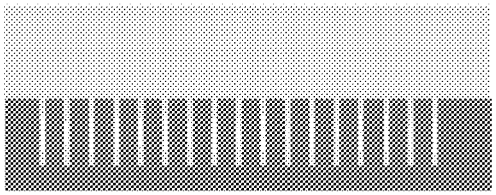
FIG. 3 (Prior Art)
FIG. 3 illustrate a schematic image of structures in a prior art reference.
Figure 3:
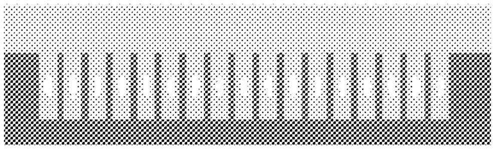
FIG. 3 (Prior Art)
Figure 3:
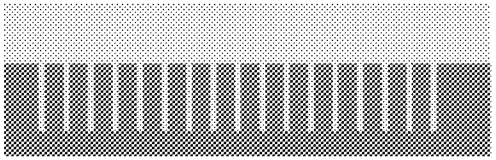
FIG. 3 (Prior Art)
Figure 3:
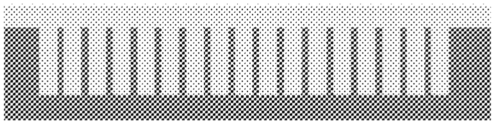
FIG. 3 (Prior Art)

FIG. 3 illustrates a schematic image of structures in a prior art reference. During step 301 including sub steps of flowing a precursor and exposing the precursor to plasma, material is deposited onto a surface of a substrate. The deposit material may solidify and may include one or more voids within a trench of the one or more trenches. The voids may be small if step 301 use high flowability condition (using e.g. high flow rate), but this may cause large delta of overburden (for example 50 nm) between narrow trenches and wide trenches. During step 308, the material deposited during step 301 may flow using a treatment. Delta of overburden is still large (for example, 60 nm) after step 308.

Figure 4:
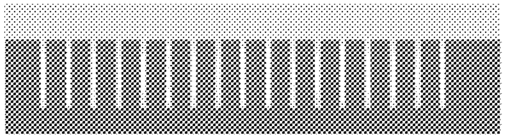
FIG. 4 illustrates a schematic image of structures in accordance with exemplary embodiments of the disclosure.
Figure 4:
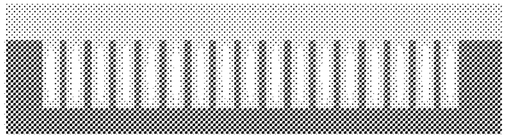
Figure 4:
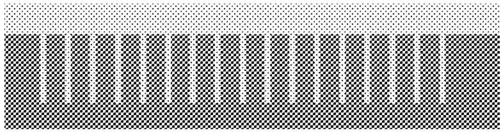
Figure 4:
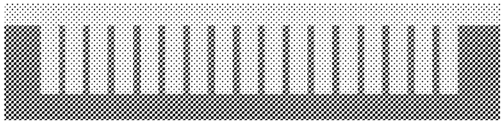
Figure 4:
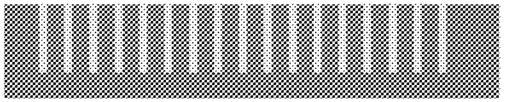
Figure 4:
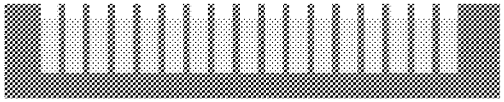
Figure 4:
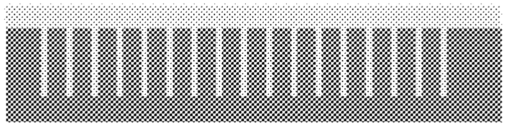
Figure 4:
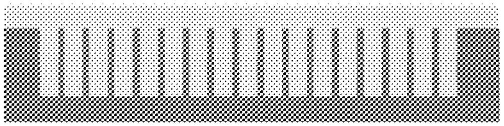

FIG. 4 illustrates a schematic image of structures in accordance with exemplary embodiments of the disclosure. During step 101 including sub steps of flowing a precursor and exposing the precursor to plasma, material is deposited onto a surface of a substrate. The deposit material may solidify and may include one or more voids within a trench of the one or more trenches. The voids may be large if step 101 uses a low flowability condition (e.g., low flow rate), but delta of overburden between narrow trenches and wide trenches is nearly zero.

During step 108, the material deposited during step 101 may flow using a treatment. Delta of overburden is moderate, for example 25 nm.

During step 109, the first deposited material may be etched to be substantially leveled in the narrow trenches and recessed in the wide trenches, keeping the same delta of overburden. Step 109 may comprise exposing an inert gas and/or an oxygen-containing gas to a plasma. Further, step 109 may be conducted in another reaction chamber.

During 2nd deposition step 112 including sub steps of flowing the carbon precursor and exposing the carbon precursor to a plasma, a second deposited material may be formed on the first deposited material. Delta of overburden between narrow trenches and wide trenches may be nearly zero (for example less than 10 nm) since the volume of deposited materials in the recessed portions of wide trenches are small.

Figure 5:
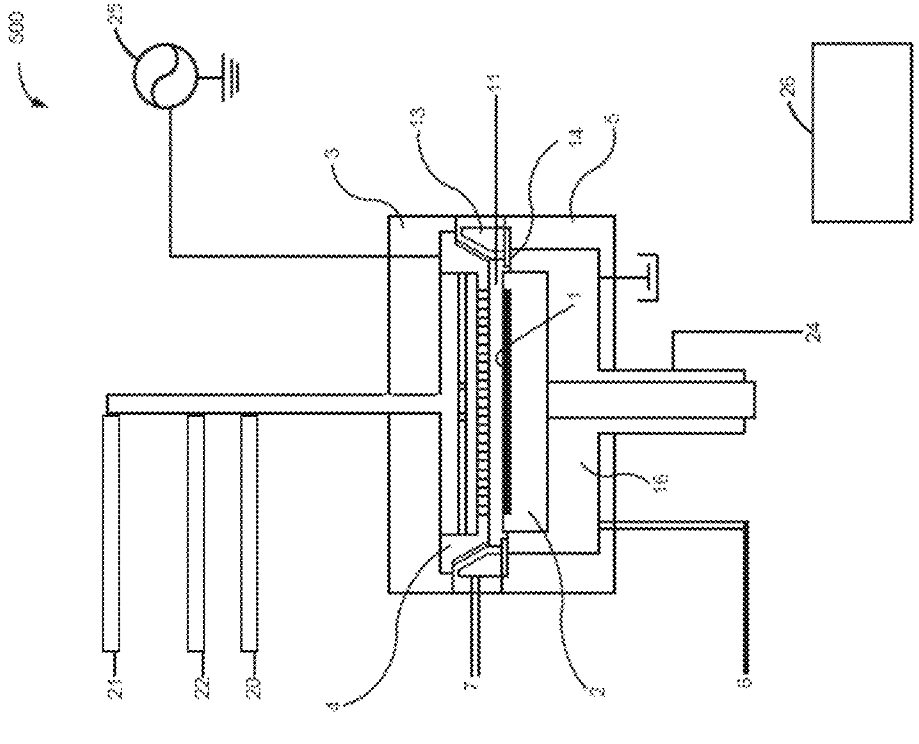
FIG. 5 illustrates a plasma system in accordance with exemplary embodiments of the disclosure.

FIG. 5 illustrates a plasma reactor system 500 in accordance with exemplary embodiments of the disclosure is illustrated. The plasma reactor system 500 may be used to perform one or more steps or sub steps as described herein and/or to form one or more structures or portions thereof as described herein.

The plasma reactor system 500 may include a pair of electrically conductive flat-plate electrodes 4, 2 in parallel and facing each other in an interior 11 (reaction zone) of a reaction chamber 3. A plasma may be excited within the reaction chamber 3 by applying, for example, HRF power (e.g., 13.56 MHz, 27 MHz, or 60 MHz) and/or low frequency power from a power source 25 to one electrode (e.g., electrode 4) and electrically grounding the other electrode (e.g., electrode 2). A temperature regulator may be provided in a lower stage 2 (the lower electrode), and a temperature of a substrate 1 placed thereon may be kept at a desired temperature. The electrode 4 may serve as a gas distribution device, such as a shower plate. Reactant gas, dilution gas, if any, precursor gas, and/or the like may be introduced into reaction chamber 3 using one or more of a gas line 20, a gas line 21, and a gas line 22, respectively, and through the shower plate 4. Although illustrated with three gas lines, the reactor system 500 may include any suitable number of gas lines.

In the reaction chamber 3, a circular duct 13 with an exhaust line 7 may be provided, through which gas in the interior 11 of the reaction chamber 3 may be exhausted. Additionally, a transfer chamber 5, disposed below the reaction chamber 3, may be provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone may be provided (a gate valve through which a wafer is transferred into or from the transfer chamber 5 is omitted from this figure). The transfer chamber may be also provided with an exhaust line 6. In some embodiments, the deposition and treatment steps may be performed in the same reaction space, so that two or more (e.g., all) of the steps may continuously be conducted without exposing the substrate to air or other oxygen-containing atmosphere.

A skilled artisan will appreciate that the apparatus includes one or more controller(s) programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan.

In some embodiments, a multiple chamber module (multiple sections or compartments for processing wafers disposed close to each other) may be used, wherein a reactant gas and a noble gas may be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method, comprising the steps of:

providing a substrate within a reaction chamber, the substrate comprising a plurality of narrow trenches and wide trenches formed on a surface of the substrate;

a $1^{st}$ deposition step comprising:

(a) flowing a carbon precursor into the reaction chamber; and (b) exposing the carbon precursor to a plasma, wherein the carbon precursor reacts to form a first deposited material;

(c) exposing the first deposited material to a post-deposition treatment to cause the first deposited material to flow within the trenches;

(d) etching the first deposited material, wherein the first deposited material is substantially level in the narrow trenches and recessed in the wide trenches; and a $2^{nd}$ deposition step comprising:

(e) flowing the carbon precursor into the reaction chamber; and (f) exposing the carbon precursor to a plasma, wherein the carbon precursor reacts to form a second deposited material on the first deposited material.

2. The method of claim 1, wherein the steps (d) to (f) are repeated.

3. The method of claim 1, further comprising a step (g) exposing the second deposited material to a post-deposition treatment.

4. The method of claim 3, wherein the steps (d) to (g) are repeated.

5. The method of claim 1, wherein a temperature during the step of the first deposition is from about 50° C. to about 600° C.

6. The method of claim 1, wherein the post-deposition treatment comprises heating the substrate to a temperature of about 100° C. to about 800° C.

7. The method of claim 1, wherein a temperature during the step of the second deposition is from about 50° C. to about 800° C.

8. The method of claim 1, wherein a power of the plasma is less than 2000 W.

9. The method of claim 5, wherein a frequency of the plasma is 3 to 30 MHz with single RF power source.

10. The method of claim 1, wherein a power of the plasma of the 1st deposition step is 200 W or less than 200 W.

11. The method of claim 1, wherein a pressure within the reaction chamber is between about 100 Pa and about 1,300 Pa.

12. The method of claim 1, wherein the post-deposition treatment comprises a plasma treatment.

13. The method of claim 12, wherein the plasma treatment comprises exposing an inert gas and/or a nitrogen-containing gas to a plasma.

14. The method of claim 13, wherein the nitrogen-containing gas is selected from the group comprising nitrogen, NH3, or N2O.

15. The method of claim 1, the etching comprises exposing an inert gas and/or an oxygen-containing gas to a plasma.

16. The method of claim 1, wherein the carbon precursor comprises a cyclic structure.

17. The method of claim 1, wherein the carbon precursor comprises a carbonyl functional group.

18. The method of claim 16, wherein the cyclic structure is selected from the group consisting of benzene, indene, cyclopentadiene, cyclohexane, pyrrole, furan, thiophene, phosphole, pyrazole, imidazole, oxazole, isoxazole, thiazole, indole, benzofuran, benzothiophene, isoindole, isobenzofuran, benzophosphole, benzimidazole, benzoxazole, benzothiazole, benzoisoxazole, indazole, benzoisothiazole, benzotriazole, purine, pyridine, phosphinine, pyrimidine, pyrazine, pyridazine, triazine, 1,2,4,5-tetrazine, 1,2,3,4-tetrazine, 1,2,3,5-tetrazine, hexazine, quinoline, isoquinoline, quinoxaline, quinazoline, cinnoline, pteridine, phthalazine, acridine, 4aH-xanthene, 4aH-thioxanthene, 4aH-phenoxazine, 4a, 10a-dihydro-10H-phenothiazine, and carbazole.

19. The method of claim 1, wherein the precursor comprises one or more carbonyl groups and one or more of a methyl group, ethyl group, propyl group, butyl group, amine group, or hydroxy group.

20. The method of claim 1, wherein the post-deposition treatment is conducted in a second reaction chamber.

21. The method of claim 20, wherein the etching step is conducted in a third reaction chamber.

* * * * *